(12) United States Patent
Demarie et al.

(10) Patent No.: US 12,348,144 B2
(45) Date of Patent: Jul. 1, 2025

(54) SELF-TEST USING REVERSE CURRENTS IN MULTIPHASE POWER SUPPLIES

(71) Applicant: International Business Machines Corporation, Armonk, NY (US)

(72) Inventors: Mark L. Demarie, Poughkeepsie, NY (US); Luke L Jenkins, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 501 days.

(21) Appl. No.: 18/056,775

(22) Filed: Nov. 18, 2022

(65) Prior Publication Data

US 2024/0171077 A1    May 23, 2024

(51) Int. Cl.
*H02M 3/158*    (2006.01)
*G01R 31/40*    (2020.01)
*H02M 1/00*    (2007.01)

(52) U.S. Cl.
CPC .......... *H02M 3/1584* (2013.01); *G01R 31/40* (2013.01); *H02M 1/0009* (2021.05)

(58) Field of Classification Search
None
See application file for complete search history.

(56) References Cited

U.S. PATENT DOCUMENTS

| | | | |
|---|---|---|---|
| 10,191,121 B2* | 1/2019 | Ou Yang | G01R 31/40 |
| 10,425,007 B2* | 9/2019 | Tang | H02H 7/1213 |
| 2024/0322563 A1* | 9/2024 | Rosenthal | B60R 16/033 |

FOREIGN PATENT DOCUMENTS

CN    107659124 A    2/2018

* cited by examiner

*Primary Examiner* — Kevin M Bernatz
(74) *Attorney, Agent, or Firm* — Matthew Zehrer

(57) ABSTRACT

A computer system, computer program product, and computer-implemented method for using reverse currents to self-test multiphase power supply circuits. The method includes executing one or more operations on at least two circuit phases of one or more multiphase power supply circuits. The multiphase power supply circuits include a plurality of circuit phases, and each multiphase power supply circuit is electrically coupled to a plurality of electric power phases. Each circuit phase is coupled to an electric power phase. Executing the operations includes adjusting the voltage on one or more first phases of the plurality of circuit phases to a plurality of voltages, and inducing a reverse current from one or more second phases of the plurality of circuit phases to the one or more first phases.

20 Claims, 11 Drawing Sheets

SELF-TEST USING REVERSE CURRENTS IN MULTIPHASE POWER SUPPLIES

BACKGROUND

The present disclosure relates to circuit testing mechanisms, and, more specifically, toward using reverse currents to self-test multiphase power supply circuits.

Multiphase power supply regulators include multiple parallel phases, that, when combined, can source a greater amount of power than through a single phase. Testing multiphase regulators typically include the use of external equipment that adds cost and complexity to the testing mechanisms. Some electronic devices and systems include a sizeable number of multiphase power supply regulators.

SUMMARY

A system, product, and method are provided for executing self-testing of multiphase power supply circuits.

In one aspect, a computer system for using reverse currents to self-test multiphase power supply circuits is presented. The system includes one or more multiphase power supply circuits including a plurality of circuit phases. Each multiphase power supply circuit of the one or more multiphase power supply circuits is electrically coupled to a plurality of electric power phases. Each circuit phase of the plurality of circuit phases is coupled to an electric power phase of the plurality of electric power phases. The system also includes one or more processing devices and one or more memory devices communicatively and operably coupled to the one or more processing devices. The system further includes a circuit self-testing tool at least partially resident within the one or more memory devices. The circuit self-testing tool is communicatively and operably coupled to the one or more multiphase power supply circuits and the one or more processing devices. The circuit self-testing tool is configured to execute one or more operations on at least two circuit phases of the one or more multiphase power supply circuits. The circuit self-testing tool is further configured to adjust a voltage on one or more first phases of the plurality of circuit phases to a plurality of voltages, and induce a reverse current from one or more second phases of the plurality of circuit phases to the one or more first phases.

In another aspect, a computer program product is presented. The product includes one or more computer readable storage media and program instructions collectively stored on the one or more computer storage media. The program instructions include program instructions to execute one or more operations on at least two circuit phases of one or more multiphase power supply circuits. The one or more multiphase power supply circuits include a plurality of circuit phases. Each multiphase power supply circuit of the one or more multiphase power supply circuits is electrically coupled to a plurality of electric power phases. Each circuit phase of the plurality of circuit phases is coupled to an electric power phase of the plurality of electric power phases. The program instructions to execute the one or more operations include program instructions to adjust a voltage on one or more first phases of the plurality of circuit phases to a plurality of voltages, and program instructions to induce a reverse current from one or more second phases of the plurality of circuit phases to the one or more first phases.

In yet another aspect, a computer-implemented method for using reverse currents to self-test multiphase power supply circuits is presented. The method includes executing one or more operations on at least two circuit phases of one or more multiphase power supply circuits. The one or more multiphase power supply circuits include a plurality of circuit phases. Each multiphase power supply circuit of the one or more multiphase power supply circuits is electrically coupled to a plurality of electric power phases. Each circuit phase of the plurality of circuit phases is coupled to an electric power phase of the plurality of electric power phases. The executing the one or more operations includes adjusting a voltage on one or more first phases of the plurality of circuit phases to a plurality of voltages, and inducing a reverse current from one or more second phases of the plurality of circuit phases to the one or more first phases.

The present Summary is not intended to illustrate each aspect of every implementation of, and/or every embodiment of the present disclosure. These and other features and advantages will become apparent from the following detailed description of the present embodiment(s), taken in conjunction with the accompanying drawings.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are illustrative of certain embodiments and do not limit the disclosure.

Figure 1:
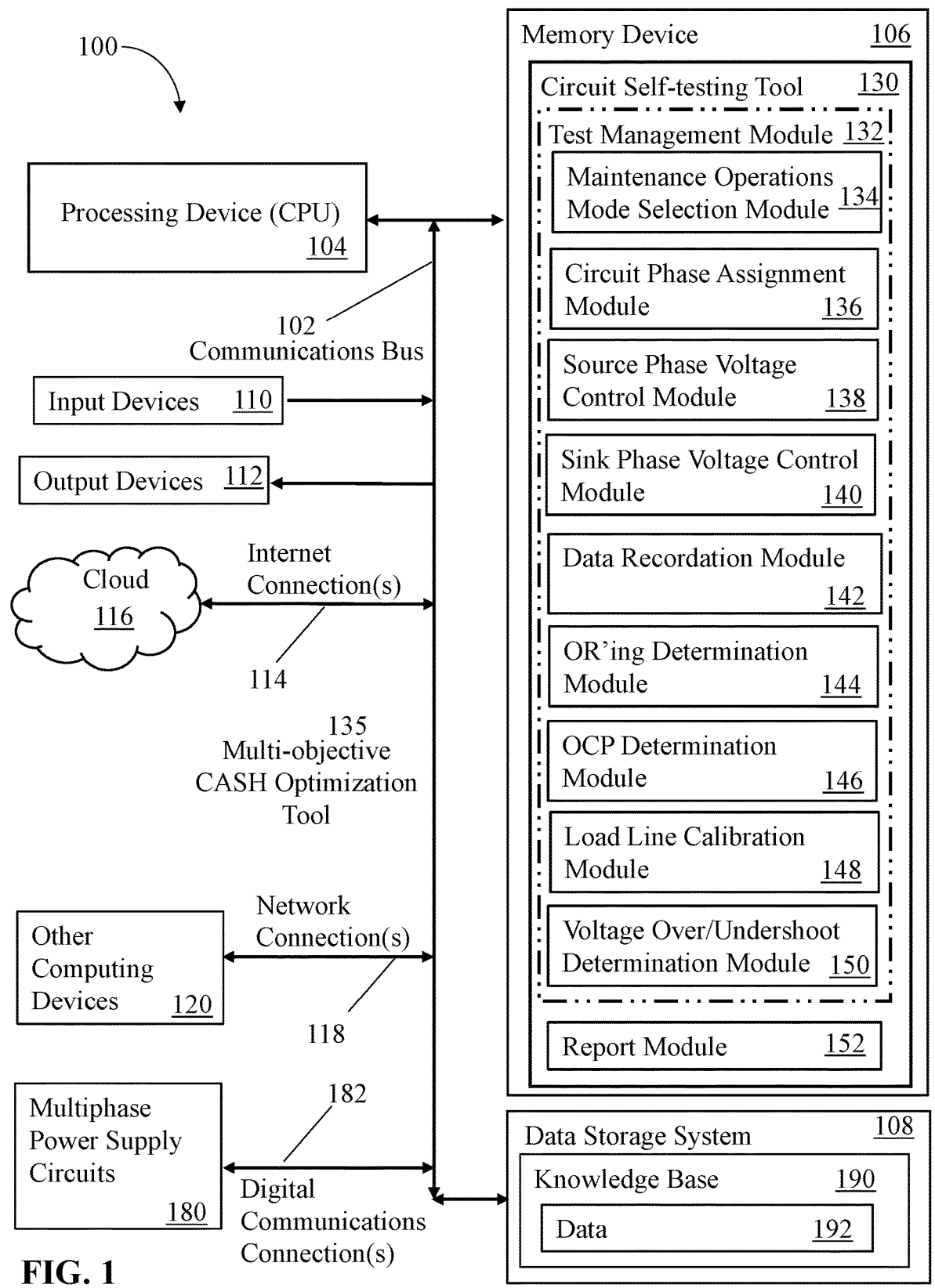
FIG. 1 is a block diagram illustrating a computer system configured to execute self-testing of multiphase power supply circuits, in accordance with some embodiments of the present disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure relate to using reverse currents to self-test multiphase power supply circuits. While the present disclosure is not necessarily limited to such applications, various aspects of the disclosure may be appreciated through a discussion of various examples using this context.

It will be readily understood that the components of the present embodiments, as generally described and illustrated in the Figures herein, may be arranged and designed in a wide variety of different configurations. Thus, the following detailed description of the embodiments of the apparatus, system, method, and computer program product of the present embodiments, as presented in the Figures, is not intended to limit the scope of the embodiments, as claimed, but is merely representative of selected embodiments.

Reference throughout this specification to "a select embodiment," "at least one embodiment," "one embodiment," "another embodiment," "other embodiments," or "an embodiment" and similar language means that a particular feature, structure, or characteristic described in connection with the embodiment is included in at least one embodiment. Thus, appearances of the phrases "a select embodiment," "at least one embodiment," "in one embodiment," "another embodiment," "other embodiments," or "an embodiment" in various places throughout this specification are not necessarily referring to the same embodiment.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiments as claimed herein.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Multiphase power supply regulators are ubiquitous throughout the world. Such known multiphase power supply regulators include multiple parallel phases, that, when combined, can source a greater amount of power than through a single phase. Plus, for example, loads connected to multiphase power supply regulators may only require one or two less phases from the multiple phases; therefore, the additional or extra phases provide some redundancy and reliability.

Many of these multiphase power supply regulators are factory-tested in the post-assembly phase prior to shipping or installation in intended equipment. Some of these regulators are periodically tested post-installation once they are installed at their intended destinations, e.g., a customer's site. For some regulators, typically at the manufacturer's site, the testing scheme includes a stress test of the regulators to find any weak or faulty components. From the collected data, a Failure In Time (FIT) rate, i.e., an expected failure rate in a predetermined time period, e.g., one billion device-hours of operation for one device, 1 million hours for 1000 devices, etc. This FIT rate is typically published by the manufacturer and those customers that do not test the regulators often rely on the advertised FIT rate for anticipating failures and or replacements. In contrast, those that test their regulators and use the captured data therefrom can have a more realistic anticipations, i.e., either better or worse performance than the FIT rates. In addition, those that test their regulators can find other potentially more problematic issues with an associated product. For example, and arguably more important than FIT rates, such testing facilitates finding assembly- and manufacturing-induced issues, e.g., component maverick lots or manufacturing quality issues.

Those multiphase regulators that are tested at the customer's site typically include external testing equipment. Some of such external testing equipment is built-in with the system that houses the regulators. Alternatively, some of such external testing equipment is portable and provided to the regulators as the testing needs arise. Regardless, such external testing equipment adds cost and complexity to the testing mechanisms and processes (including the labor costs). Some electronic devices and systems include a sizeable number of multiphase power supply regulators, thereby exacerbating the costs. Furthermore, some systems need to be removed from service in order to test the regulators. As a result, many features on many of these known regulators are untested post-assembly due to infrastructure limitations including cost, equipment configuration limitations, and accessibility limitations.

In some embodiments, in order to more efficiently use the space in equipment and systems, some known power regulators are placed on memory cards, thereby further increasing the obstacles to periodic testing of the power regulators. For example, it is significantly more difficult to test the regulators on a memory card than regulators more readily accessible with the test equipment because as the size scales downward it becomes more impractical to test with external equipment, i.e., due to a loss of test points and probe access. Furthermore, as the volume scales upward, more testing infrastructure and time are necessary. Accordingly, a better combination of system testing mechanisms and testing processes are needed to provide customers with reliable, accurate, easy-to-use, and cost-effective multiphase power supply regulators testing.

Some known multiphase power supplies use phase current testing through a plurality of output phases, where each phase is configured to deliver a phase current through a separate inductor and an output capacitor to a load connected to the output phases (see U.S. Ser. No. 10/425,007B2 and CN107659124B). The multiphase regulator further includes a controller containing a self-test unit configured to execute a self-test method. The controller is configured to regulate a voltage delivered to the load by adjusting the phase currents delivered to the load by the output phases, monitor the phase currents delivered to the load by the output phases, test the output phases in a predetermined sequence, and determine if the phase currents respond in a predetermined way. A multiphase pulse width modulator (PWM) switches the output phases of the power stage so that the power stage sources positive current to the load through one or more of the high-side transistors during some periods and sinks negative current from the load through one or more of the low-side transistors during other periods.

Some known power supply devices (PSDs) of a server unit configured with a multiphase voltage regulator scheme include a system and method for voltage regulator self-burn-in testing (see U.S. Ser. No. 10/191,121B2). During a test of a specific power stage, the specific power stage is in the "ON" state, where a high-side metal oxide-semiconductor field-effect transistor (MOSFET) is switched on, and low-side MOSFETs of the other power stages function as a load for the specific power stage. A pulse width modulation (PWM) controller collects data from a voltage sensing circuit, a current sensing circuit, and/or a temperature sensor of the specific power stage. Test mode commands can be sent to the PSD via a system management bus (SMBus), inter IC bus (I2C), or power management bus (PMBus) whenever a self-burn-in test is needed. The self-burn-in testing uses parallel phases to perform the burn-in test. At least one phase is used to load another phase, but only in a binary on/off manner, without any means of modulation, regulation, or control through a continuous range of voltage and current values (see FIGS. 1B-1E).

Referring to FIG. 1, a block diagram is presented illustrating a computer system, i.e., multiphase power supply circuit self-testing system 100 (herein referred to as "the system 100") that is configured to execute self-testing of multiphase power supply circuits 180 (discussed further below), in accordance with some embodiments of the present disclosure. The system 100 includes one or more processing devices 104 (only one shown) communicatively and operably coupled to one or more memory devices 106 (only one shown) through a communications bus 102, and in some embodiments, through a memory bus (not shown). In some embodiments, the processing device 104 is a multicore processing device. The system 100 also includes a data storage system 108 that is communicatively coupled to the processing device 104 and memory device 106 through the communications bus 102. In at least some embodiments, the data storage system 108 provides storage to, and without limitation, a knowledge base 190 that includes at least a portion of the data to enable operation of the system 100 as described further herein.

The system 100 further includes one or more input devices 110 and one or more output devices 112 communicatively coupled to the communications bus 102. In addition, the system 100 includes one or more Internet connections 114 (only one shown) communicatively coupled to the cloud 116 through the communications bus 102, and one or more network connections 118 (only one shown) communicatively coupled to one or more other computing devices 120 through the communications bus 102. In some embodiments, the Internet connections 114 facilitate communication between the system 100 and one or more cloud-based centralized systems and/or services (not shown in FIG. 1). In at least some embodiments, the system 100 is a portion of a cloud computing environment (see FIG. 10), e.g., and without limitation, the system 100 is a computer system/server that may be used as a portion of a cloud-based systems and communications environment through the cloud 116 and the Internet connections 114.

In one or more embodiments, a circuit self-testing tool 130 (herein referred to as "the tool 130") is at least partially resident within the memory device 106. In some embodiments, the circuit self-testing tool 130 is fully resident within the memory device 106. The tool 130 is discussed in detail further in this disclosure. The tool 130 is configured to execute the self-testing operations, and, more specifically, to automatically execute one or more of a plurality of operations for circuit features including, without limitation, OR'ing threshold verification, over-current protection (OCP) verification, static load emulation (for executing predetermined target loads for circuit calibration), and dynamic load emulation (for determining voltage overshoot and undershoot). As used herein, the testing operations, calibration operations, and determination operations are maintenance operations that are broadly referred to as testing and tests. In at least some embodiments, the tool 130 resident in the memory device 106 is configured to run continuously in the background to automatically execute the self-testing processes. In some embodiments, the tool 130 is directly engaged for specific tasking by the users thereof, e.g., and without limitation, manual execution commands.

In at least some embodiments, the tool 130 is configured to execute the suite of self-testing operations. The tool 130 includes a test management module 132 that is configured to manage the operation of the individual testing components as described further. As shown in FIG. 1, the test management module 132 includes the modules for the individual testing components. In some embodiments, the test management module 132 is a stand-alone module that is communicatively and operatively coupled to the individual testing components. The tool 130 also includes maintenance operations mode selection module 134 that is configured to select the self-testing mode for the circuit features desired to be tested including, without limitation, one or more of over-current protection, OR'ing threshold verification, static load emulation, and dynamic load emulation. The tool 130 further includes a circuit phase assignment module 136 configured to determine which circuit phases of the multiphase circuit will be the source and the sink for the respective operations. As used herein, the term "circuit phase" is used to distinguish the respective circuit branches from the respective electric power phases of the electric power sources to which they are electrically coupled.

In some embodiments, the tool 130 further includes a source phase voltage control module 138 and a sink phase voltage control module 140, where each respective module 138 and 140 is configured to increment and decrement the respective source voltage and sink voltage. The tool 130 also includes a data recordation module 142 to record the data collected during the testing and other operations. In addition, the tool 130 includes a module for each of the test-dependent determinations, i.e., an OR'ing determination module 144, an OCP determination module 146, a load line calibration module 148 (corresponding to static load emulation for circuit calibration), and a voltage over/undershoot determination module 150 (corresponding to the dynamic load emulation). In at least some embodiments, the tool 130 is configured to perform one or more of an OR'ing determination, an overcurrent protection (OCP) determination, a load line calibration, and a voltage undershoot and overshoot determination, as selected by the maintenance operations mode selection module 134. The tool 130 further includes any modules for any testing operations not specifically described herein.

In one or more embodiments, a report module 152 configured to generate and transmit the reports resulting from the data collected by the data recordation module 142, including the results of the test-dependent determination modules 144, 146, 148, and 150 for their respective tests.

Moreover, in at least some embodiments, the system 100 includes one or more multiphase power supply circuits 180 communicatively and operatively coupled to the circuit self-testing tool 130 through one or more digital communications connections 182 and the communications bus 102.

Further, in some embodiments, the data storage system 108 is configured to maintain a knowledge base 190 that includes any data 192 the circuit self-testing tool 130 needs for proper test execution. The data storage system 108 is also configured to store the data collected during the testing including the data collected by the data recordation module 142, including the results of the test-dependent determination modules 144, 146, 148, and 150 for their respective tests, and the reports generated through the report module 152.

Figure 2:
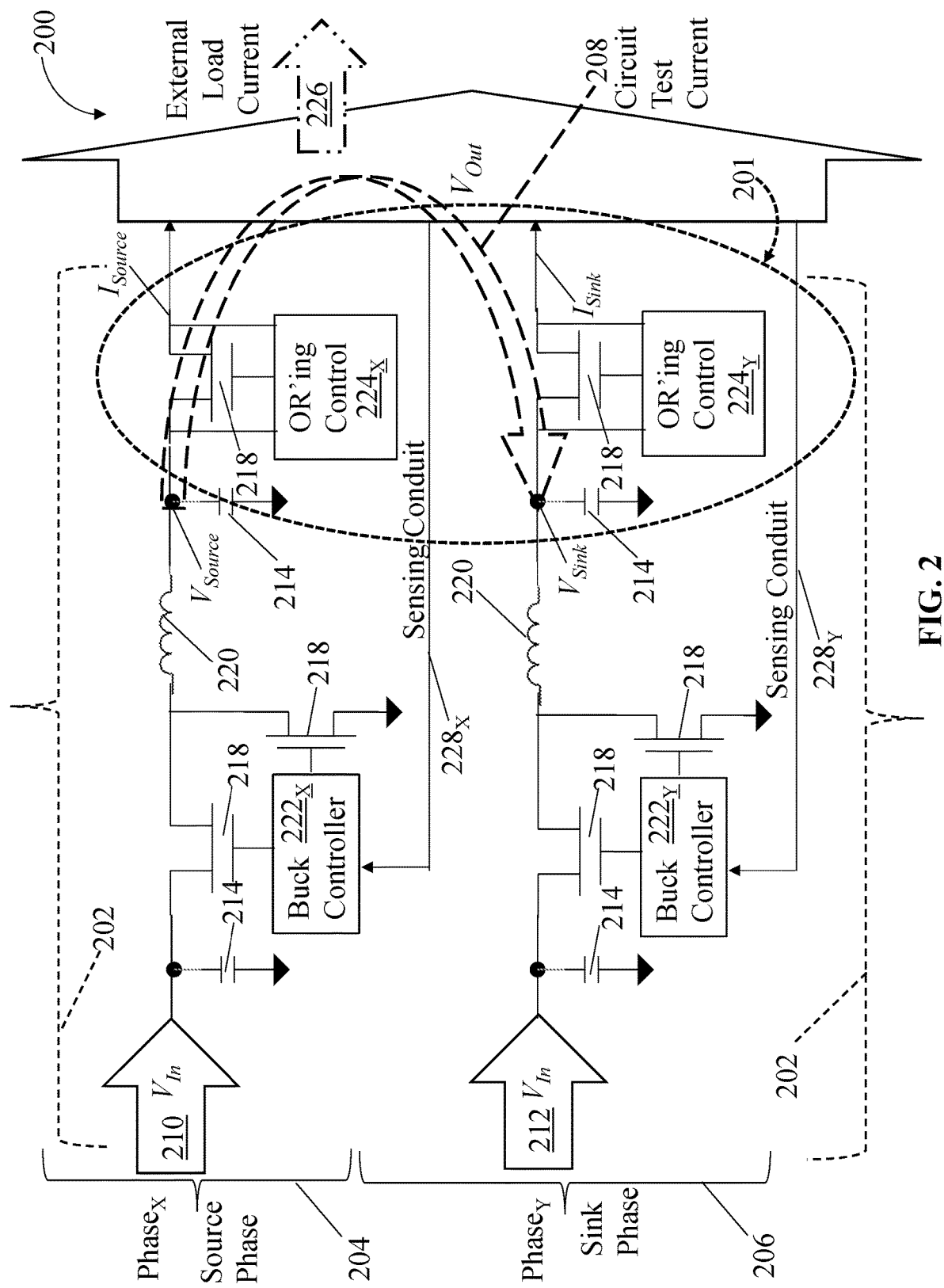
FIG. 2 is a block schematic diagram illustrating an OR'ing verification test embodiment of a multiphase power supply circuit, in accordance with some embodiments of the present disclosure.

Referring to FIG. 2, a block schematic diagram is presented illustrating an OR'ing verification test embodiment 201 of a multiphase power supply circuit 200 (herein referred to as "the circuit 200"), in accordance with some embodiments of the present disclosure. Also referring to FIG. 1, in at least some embodiments, the circuit 200 is at least a portion of the multiphase power supply circuits 180 that are included within the system 100. The circuit 200 is coupled to the circuit self-testing tool 130 through one or more digital communications connections 182. The circuit 200 includes a plurality of circuit phases 202, where each circuit phase 202 is coupled to a phase of electric power transmitted from one or more electric power sources (not shown). As used herein, the term "circuit phase" is used to distinguish the respective circuit branches, i.e., circuit phases 202, from the respective electric power phases of the electric power sources to which they are electrically coupled. As described herein, each of the circuit phases 202 define a buck regulator topology including buck controller features such as a buck controller module 222 (discussed further herein). Only two circuit phases 202 are shown in FIG. 2, i.e., circuit phase$_X$ and circuit phase$_Y$, where the variables X and Y are any integers that enable operation of the circuit 200 as described herein. One circuit phase 202 is a source phase 204 and the other circuit phase 202 is a sink phase 206, where the term "source phase" refers to the source of a circuit test current 208, and the term "sink phase" refers to the target for the circuit test current 208. For example, in some embodiments, as shown in FIG. 2, the circuit phase$_X$ is the source phase 204 and the circuit phase$_Y$ is the sink phase 206; and in some embodiments, the circuit phase$_Y$ is the source phase 204 and the circuit phase$_X$ is the sink phase 206 (not shown in FIG. 2). The components of the circuit phases 202, including the circuit phase$_X$ (the source phase 204) and the circuit phase$_Y$ (the sink phase 206) in the OR'ing verification test embodiment 201 are discussed further herein.

In some embodiments, there are 16 circuit phases 202, and as applied to FIG. 2, the variable X is any number from 1 through 16, and the variable Y is any number from 1 through 16 excluding the value of X. The circuit 200 includes any number of circuit phases 202 that enable operation of the circuit 200 within the bounds of physical practicality, including, without limitation 24 or more circuit phases 202. In addition, any number of circuit phases 202 may be a source phase 204 and any number of circuit phases 202 may be a sink phase 206 such that simultaneous multiple tests are executed. Moreover, more than one source phase 204 may be used to generate the circuit test current 208 to test a sink phase 206 and more than one sink phase 206 may receive the circuit test current 208 from one or more source phases 204. Accordingly, the circuit 200 includes at least two circuit phases 202, where any circuit phase 202 can be the source phase 204 and the sink phase 206.

In at least some embodiments, the source phase 204 (circuit phase$_X$) is energized with a voltage $V_{In}$ as shown by arrow 210, where $V_{In}$ has any value that enables operation of the circuit 200 and the OR'ing verification test embodiment 201 as described herein. The sink phase 206 (circuit phase$_Y$) is energized with the voltage $V_{In}$ as shown by arrow 212, where the two $V_{In}$ typically have the same value. In some embodiments, the two values of $V_{In}$ are different. In view of the buck regulator topology, each of the circuit phases 202 include capacitive devices 214, metal oxide-semiconductor field-effect transistor (MOSFETs) 218, inductive devices 220, and a respective buck controller module $222_X$ and $222_Y$. Furthermore, each of the circuit phases 202 include a respective OR'ing control module $224_X$ and $224_Y$ (discussed further herein). Therefore, the circuit 200 is at least a portion of the DC-DC buck power supply that includes OR'ing threshold verification using self-generated reverse currents. The circuit phases 202 induce an output voltage $V_{Out}$ that is used to energize the downstream loads (not shown) through an external load current 226. Each of the source phases 204 and sink phases 206 include a sensing conduit $228_X$ and $228_Y$, respectively, where each conduit $228_X$ and $228_Y$ is configured to feedback the output voltage $V_{Out}$ to the respective buck controllers $222_X$ and $222_Y$, respectively. As shown in FIG. 2, each of the circuit phases 202 are substantially similar; however, in some embodiments, not all of the phases 202 are substantially similar and include, or do not include, varying components therein. In at least some embodiments, the buck controller modules $222_X$ and $222_Y$ modulate the voltages induced therefrom to the OR'ing control modules $224_X$ and $224_Y$, respectively, to generate and transmit the circuit test current 208 with the desired polarity.

Figure 3:
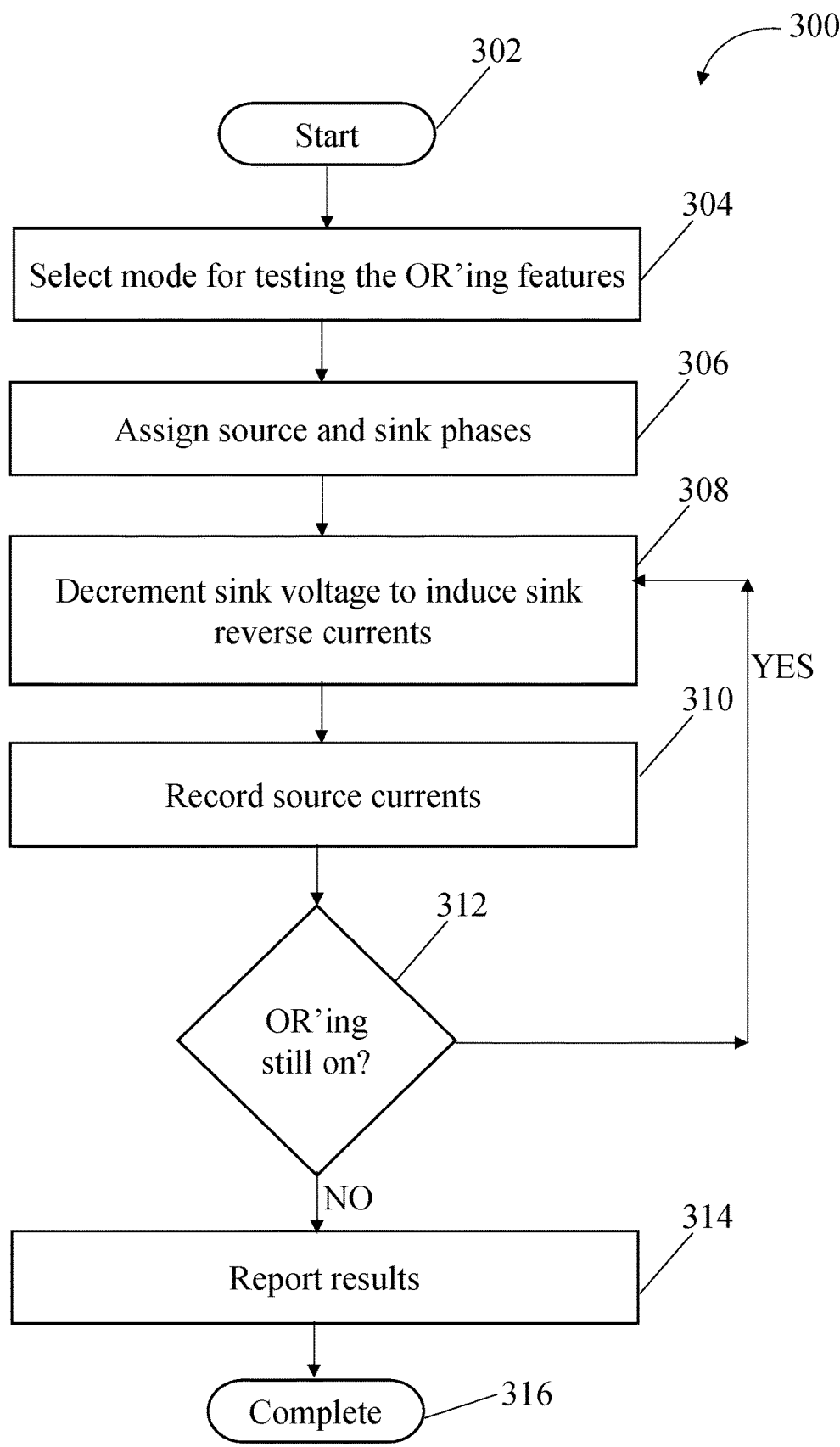
FIG. 3 is a flowchart illustrating a process for executing a test through the OR'ing verification test embodiment shown in FIG. 2, in accordance with some embodiments of the present disclosure.

Referring to FIG. 3, a flowchart is provided illustrating a process 300 for executing a test of the OR'ing verification test embodiment 201 of the circuit 200 shown in FIG. 2, in accordance with some embodiments of the present disclosure. The OR'ing features are embodied as the OR'ing control modules $224_X$ and $224_Y$ that are configured to substantially block reverse current flow into the respective circuit phases 202 at a predetermined threshold. In some embodiments, the OR'ing control module $224_Y$ is tested. Also referring to FIGS. 1 and 2, the process 300 starts 302 that includes employing the test management module 132 resident in the circuit self-testing tool 130. Specifically, in one embodiment, the maintenance operations mode selection module 134 selects 304 a maintenance operation mode configured for testing the OR'ing features of the circuit 200. Upon selecting 304 the OR'ing function test mode, the source phases and the sink phases are assigned 306. In one embodiment, the source phase 204 and the sink phase 206 are assigned 306, respectively, through the circuit phase assignment module 136.

In at least some embodiments, the sink phase voltage control module 140 regulates the buck controller $222_Y$ to decrement 308 the sink voltage, i.e., $V_{Sink}$ (see FIG. 2) to induce sink reverse currents, i.e., circuit test current 208, up to the predetermined threshold. In some embodiments, the $V_{Sink}$ is decremented in a sequence of decreasing values, e.g., and without limitation, two or more non-zero voltage decrements. In some embodiments, the $V_{Sink}$ is decremented in a smooth, continuous action without any stopping points until the test is ended. In some embodiments of the test, the source voltage, i.e., $V_{Source}$ (see FIG. 2) is maintained substantially constant, and in some embodiments, $V_{Source}$ is also regulated through incrementing and decrementing to regulate the circuit test current 208, where such regulation is achieved through the source phase voltage control module 138, and the manner of incrementing of the source voltage is similar to the manner of decrementing of the sink voltage. In some embodiments, $V_{Source}$ and $V_{Sink}$ are referred to as the local voltages for the respective circuit phase$_X$ and circuit phases. In some embodiments, the voltage regulation of $V_{Source}$ and $V_{Sink}$ is established through Power Management Bus (PMBUS®) enabled devices. In some embodiments, the voltage regulation of $V_{Source}$ and $V_{Sink}$ is established through external digital-to-analog converters (not shown) that are communicatively and operatively coupled to the regulation control circuits for the respective power supplies. In some embodiments, the source currents $I_{Source}$ (see FIG. 2) are recorded 310 through the data recordation module 142. In some embodiments, the sink currents $I_{Sink}$ (see FIG. 2) are recorded as well for additional verification of the test.

Figure 4:
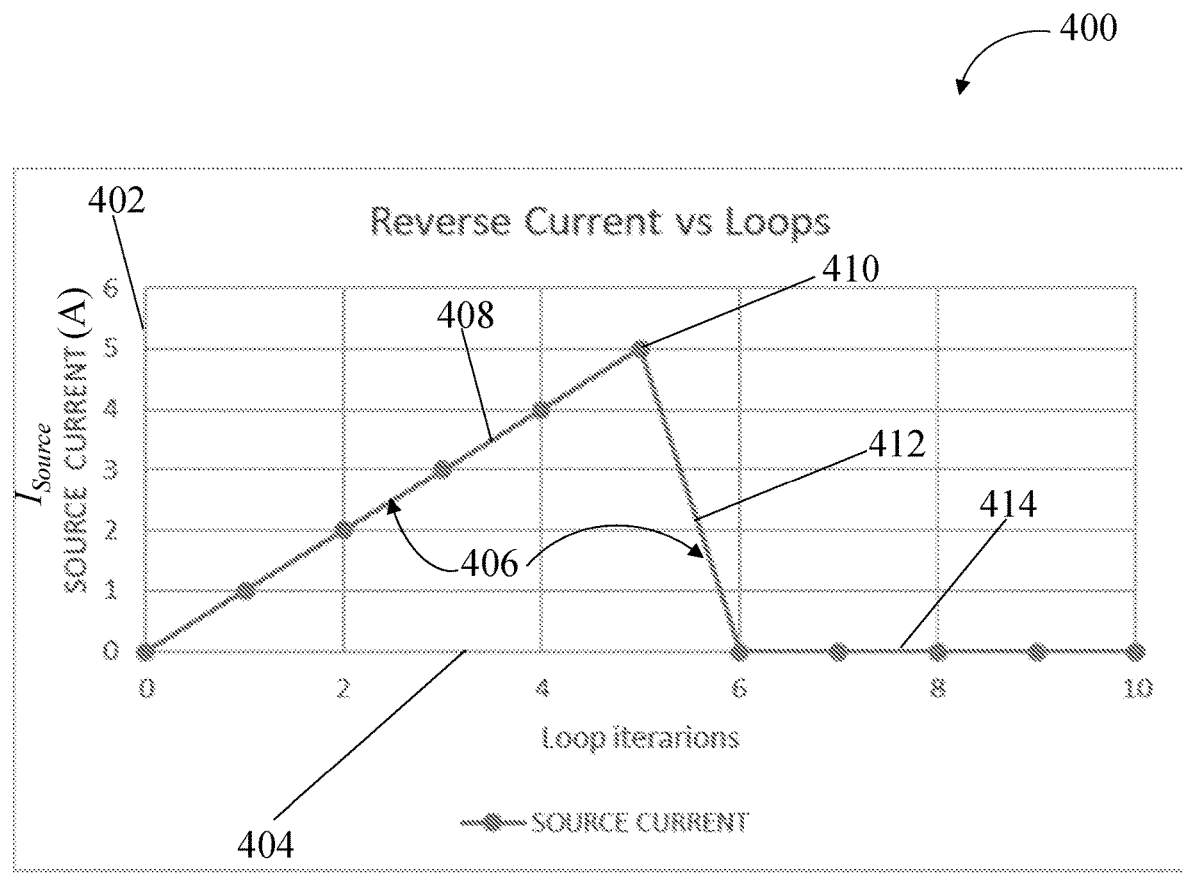
FIG. 4 is a graphical representation of recorded results from the process executed as shown in FIG. 3, in accordance with some embodiments of the present disclosure.

Referring to FIG. 4, a graphical representation 400 is provided (herein referred to graph 400) of the recorded results, i.e., the source currents $I_{Source}$ from the process 300 executed as shown in FIG. 3, in accordance with some embodiments of the present disclosure. The graph 400 includes an ordinate (Y-axis) 402 representative of the source current $I_{Source}$ as recorded 310 in units of amperes (amps, or A) extending in one A increments from 0 A to 6 A. The graph 400 also includes an abscissa (X-axis) 404 representing the number of iterations in units of loop iterations executed through the process 300 extending in increments of 2 iterations from 0 iterations to 10 iterations.

Referring again to FIG. 3, as well as FIG. 4 and FIGS. 1 and 2, in one or more embodiments, the process steps 308 and 310 are performed iteratively. The OR'ing determination module 144 operates an OR'ing decision module 312. For each loop iteration of the process steps 308→310→312→308, the $I_{Source}$ is recorded for the respective loop iteration. In some embodiments, the $I_{Source}$ values as recorded, the generated circuit test current 208, and the external load current 226 need to be related to, and distinguished from each other. Therefore, in some embodiments, the $I_{Sink}$ of the sink phase 206 is temporarily nulled such that a baseline value of $I_{Source}$ is established immediately prior to initialization of the test. Once the test is established, the changes in the value of $I_{Source}$ are directly attributable to the changes in the circuit test current 208. In some embodiments with more than the two circuit phases 202 as shown, the circuit phases 202 not being tested may have their output currents regulated to maintain the demand associated with the external load current in concert with the regulation of the source phase 204 and the sink phase 206. As such, the source phase 204 and the sink phase 206 are substantially isolated from changes to the demand of the external load current 226 such that changes to the recorded $I_{Source}$ remain substantially representative of the changes to the circuit testing current 208 as the test progresses. That is, the established baseline $I_{Source}$ value recorded prior to the test is subtracted from the recorded $I_{Source}$ values recorded during the test to produce the respective circuit testing currents 208.

If the determination is that "YES" the OR'ing feature is still on, the process 300 returns to the method step 308 for another decremental change to the sink voltage $V_{Sink}$. For reasons of simple explanation, the first pass through the iterative loop process steps 308→310→312→308 result in a recorded $I_{Source}$ of 1 A. The process 300 through the sink phase voltage control module 140 continues to decrement the sink voltage $V_{Sink}$ thereby increasing the reverse current, i.e., the circuit test current 208 until the OR'ing control module 224$_Y$ shuts off due to the reverse current. As such, in the present embodiment, each successive loop iteration 2 through 5 results in a 1 A increase of $I_{Source}$ from the value recorded in the previous iteration to define a portion 408 of a resulting plot 406 of the results. For simplicity, the portion 408 is shown as substantially linear in the present embodiment; however, in some embodiments, the portion 408 is not linear. On the sixth iteration of the iterative loop the recorded $I_{Source}$ is zero indicative of the determination of the OR'ing decision module 312 of "NO" for the OR'ing features are no longer on, the removal (opening) of the flowpath for the circuit testing current 208 results in cessation of the circuit test current 208. Therefore, the attainment of reverse current in excess of 5 A is the trigger to stop the test. A portion 412 of the plot 406 is shown as a rapid linear reduction of the $I_{Source}$. The remaining loop iterations 7 through 10 are shown as zero for the portion 414 of the plot 406; however, the process 300 does not actually execute any further loop iterations and instead advances to reporting 314 the results through the report module 152. The process 300 is completed 316. In some embodiments, a predetermined amount of hysteresis is used to accurately trigger the OR'ing decision module 312. Once the OR'ing control module 224$_Y$ is shut off, then the highest recorded $I_{Source}$ equal to the current at which the OR'ing circuits shut off is identified. The sensing conduits 228$_X$ and 228$_Y$ transmit the $V_{Out}$ values to the respective buck controllers 222$_X$ and 222$_Y$ to further facilitate the regulation of $V_{Source}$ and/or $V_{Sink}$, and the subsequent circuit test current 208.

Figure 5:
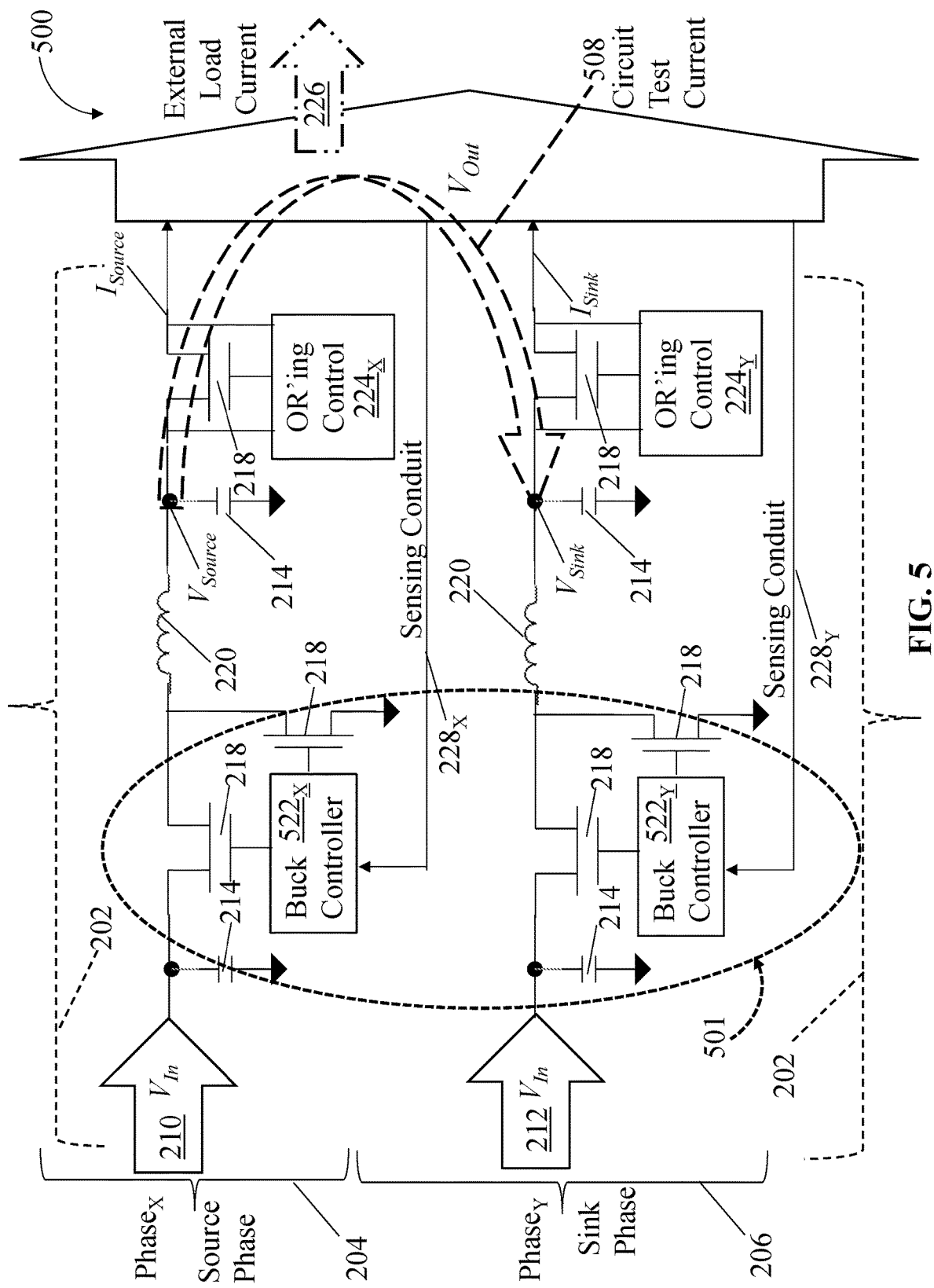
FIG. 5 is a block schematic diagram illustrating an overcurrent protection (OCP) test verification embodiment of a multiphase power supply circuit, in accordance with some embodiments of the present disclosure.

Referring to FIG. 5, a block schematic diagram is presented illustrating an overcurrent protection (OCP) verification test embodiment 501 of a multiphase power supply circuit 500 (herein referred to as "the circuit 500"), in accordance with some embodiments of the present disclosure. Also referring to FIG. 1, in at least some embodiments, the circuit 500 is at least a portion of the multiphase power supply circuits 180 that are included within the system 100. The circuit 500 is coupled to the circuit self-testing tool 130 through one or more digital communications connections 182. In some embodiments, portions of the circuit 500 are integrated with both OR'ing functions and OCP functions. Therefore, as shown, FIG. 5 retains a substantial portion of the numbering presented in FIG. 2. Accordingly, a significant portion of the description of FIG. 5 is provided with FIG. 2 and the differences are discussed further. In some embodiments, implementation of a combined scheme including both OR'ing features as previously described and OCP features may result in the OR'ing threshold being lower than the OCP threshold, thereby preventing execution of OCP verification tests. Therefore, in some embodiments, multiple sink phases 206 are employed. In some embodiments, the OR'ing features of the selected sink phase 206 are temporarily disabled during the OCP verification test.

In some embodiments, each of the source phases 204 and sink phases 206 include the buck controller module 522$_X$ and 522$_Y$, respectively. In some embodiments, the operational OCP features are embedded within the respective buck controller module 522$_X$ and 522$_Y$, where the OCP verification test embodiment 501 is positioned proximate the buck controller modules 522$_X$ and 522$_Y$.

Figure 6:
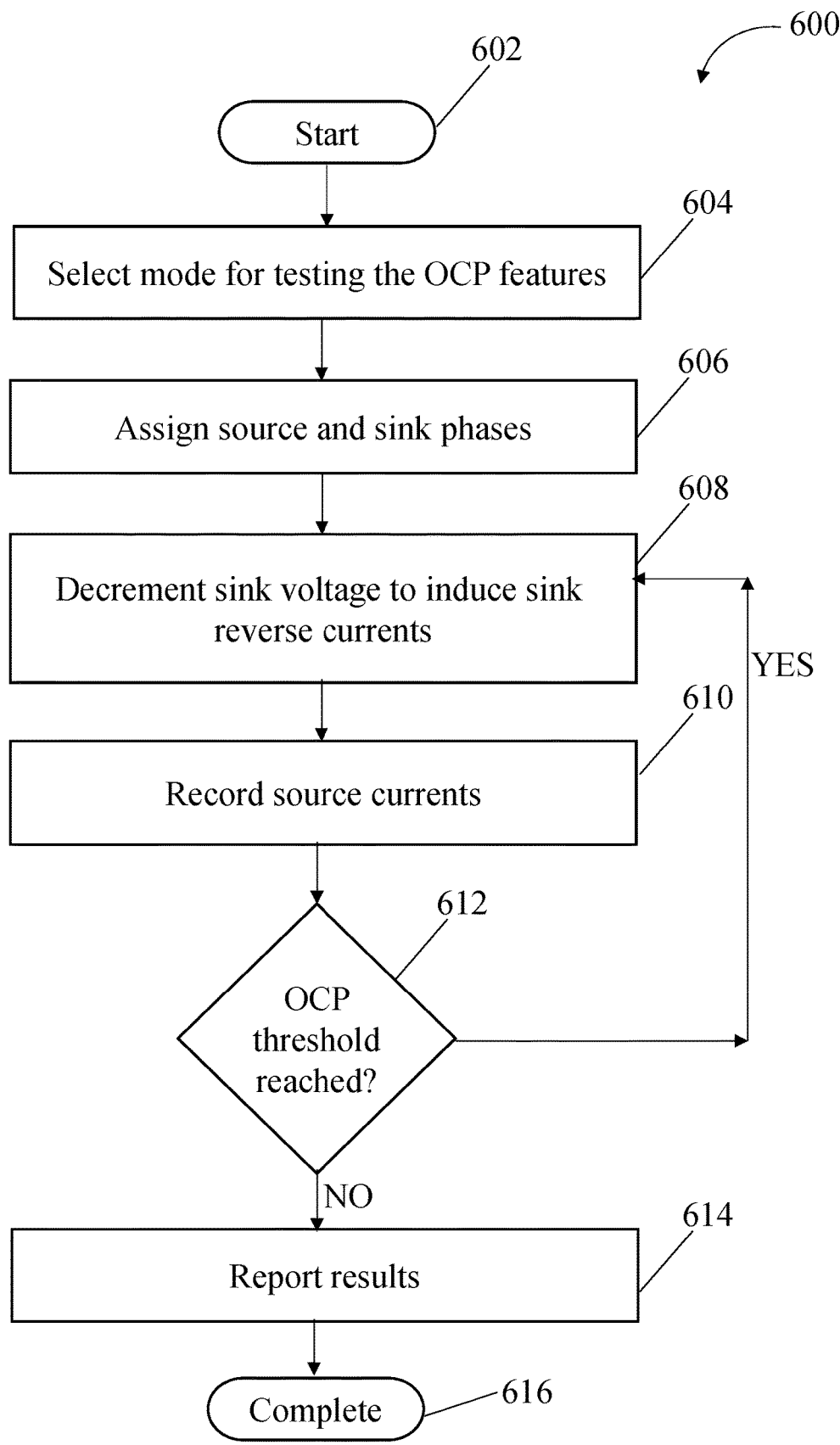
FIG. 6 is a flowchart illustrating a process for executing a test through the OCP test verification embodiment shown in FIG. 5, in accordance with some embodiments of the present disclosure.

Referring to FIG. 6, a flowchart is provided illustrating a process 600 for executing a test of the OCP verification test embodiment 501 of the circuit 500 shown in FIG. 5, in accordance with some embodiments of the present disclosure. Also referring to FIGS. 1 and 5, the process 600 starts 602 that includes employing the test management module 132 resident in the circuit self-testing tool 130. Specifically, in one embodiment, the maintenance operations mode selection module 134 selects 604 a test mode configured for testing the OCP features of the circuit 500. Upon selecting 604 the OCP function test mode, the source phases and the sink phases are assigned 606. In one embodiment, the source phase 204 and the sink phase 206 are assigned 606, respectively, through the circuit phase assignment module 136.

In at least some embodiments, the sink phase voltage control module 140 regulates the buck controller $522_Y$ to decrement 608 the sink voltage, i.e., $V_{Sink}$ (see FIG. 5) to induce sink reverse currents, i.e., circuit test current 508, up to the predetermined threshold. In some embodiments, the $V_{Sink}$ is decremented in a sequence of decreasing values, e.g., and without limitation, two or more non-zero voltage decrements. In some embodiments, the $V_{Sink}$ is decremented in a smooth, continuous action without any stopping points until the test is ended. In some embodiments of the test, the source voltage, i.e., $V_{Source}$ (see FIG. 5) is maintained substantially constant, and in some embodiments, $V_{Source}$ is also regulated through incrementing and decrementing to regulate the circuit test current 508, where such regulation is achieved through the source phase voltage control module 138. In some embodiments, the highest value for $I_{Source}$ (see FIG. 5) may be a starting point for the test, i.e., the $V_{Sink}$ is decremented to establish that value of $I_{Source}$. In some embodiments, the source currents $I_{Source}$ are recorded 610 through the data recordation module 142. In some embodiments, the sink currents $I_{Sink}$ (see FIG. 5) are recorded as well for additional verification of the test. The sensing conduits $228_X$ and $228_Y$ transmit the $V_{Out}$ values to the respective buck controllers $522_X$ and $522_Y$ to further facilitate the regulation of $V_{Source}$ and/or $V_{Sink}$, and the subsequent circuit test current 508.

In one or more embodiments, the process steps 608 and 610 are performed iteratively. The OCP determination module 146 operates an OCP decision module 612. For each loop iteration of the process steps 608→610→612→608, the $I_{Source}$ is recorded for the respective loop iteration. As described for FIGS. 2 and 3, the changes to the recorded $I_{Source}$ are substantially representative of the changes to the circuit testing current 508 as the test progresses. That is, the established baseline $I_{Source}$ value recorded just prior to the test is subtracted from the recorded $I_{Source}$ values recorded during the test to produce the respective circuit testing currents 508.

If the determination is that "NO" the OCP feature current threshold has not been reached, the process 600 returns to the method step 608 for another decremental change to the sink voltage $V_{Sink}$. The process 600 through the sink phase voltage control module 140 continues to decrement the sink voltage $V_{Sink}$ thereby increasing the reverse current, i.e., the circuit test current 508 until the buck controller module $522_X$ disables the source phase 204, preferably at the predetermined overcurrent threshold. If the determination of the OCP decision module 612 is "YES" for the OCP threshold being reached, the removal (opening) of the flowpath for the circuit testing current 508 results in cessation of the circuit test current 508. In some embodiments, the attainment of OCP is indicated by a rapid decrease of the recorded $I_{Source}$ and/or the output voltage of the source phase 204 through monitoring by the buck controller $222_X$. In some embodiments, the attainment of OCP is determined through actuation of a binary digital monitoring status. The value of $I_{Source}$ at the time of the actuation of the OCP features is part of the recorded data. The process 600 advances to reporting 614 the results through the report module 152. The process 600 is completed 616. Once the OCP is detected, then the highest recorded $I_{Source}$ equal to the current at which the OCP circuits tripped the source phase 204 is identified.

Figure 7:
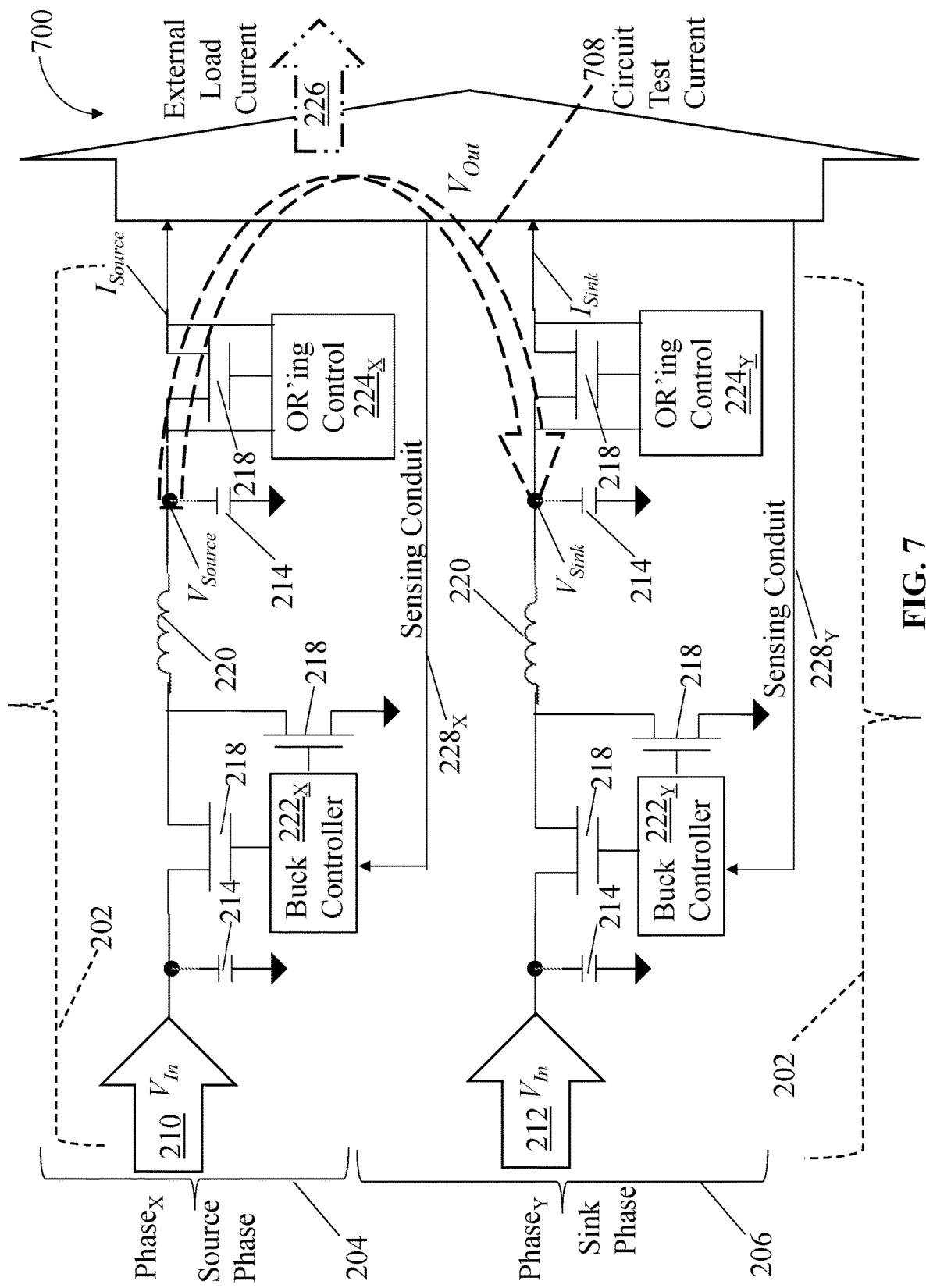
FIG. 7 is a block schematic diagram illustrating a calibration architecture of a multiphase power supply circuit, in accordance with some embodiments of the present disclosure.

Referring to FIG. 7, a block schematic diagram is presented illustrating a calibration architecture 701 associated with a multiphase power supply circuit 700, in accordance with some embodiments of the present disclosure. Also referring to FIG. 1, in at least some embodiments, multiphase power supply circuit 700 is at least a portion of the multiphase power supply circuits 180 that are included within the system 100. The multiphase power supply circuit 700 is coupled to the circuit self-testing tool 130 through one or more digital communications connections 182. The multiphase power supply circuit 700 is similar to the multiphase power supply circuits 200 and 500, where the majority of the numbering from FIGS. 2 and 5 are maintained. In general, the calibration operations executed by the calibration architecture 700 will not induce engagement of the OR'ing or OCP features as previously described herein.

In some embodiments, each of the source phases 204 and sink phases 206 include the buck controller module $222_X$ and $222_Y$ that are at least a portion of the DC-DC Buck power supply that includes calibration features using self-generated reverse currents. In at least some embodiments, the buck controller modules $222_X$ and $222_Y$ modulate the voltages to generate and transmit the circuit test current 708 with the desired polarity.

Figure 8A:
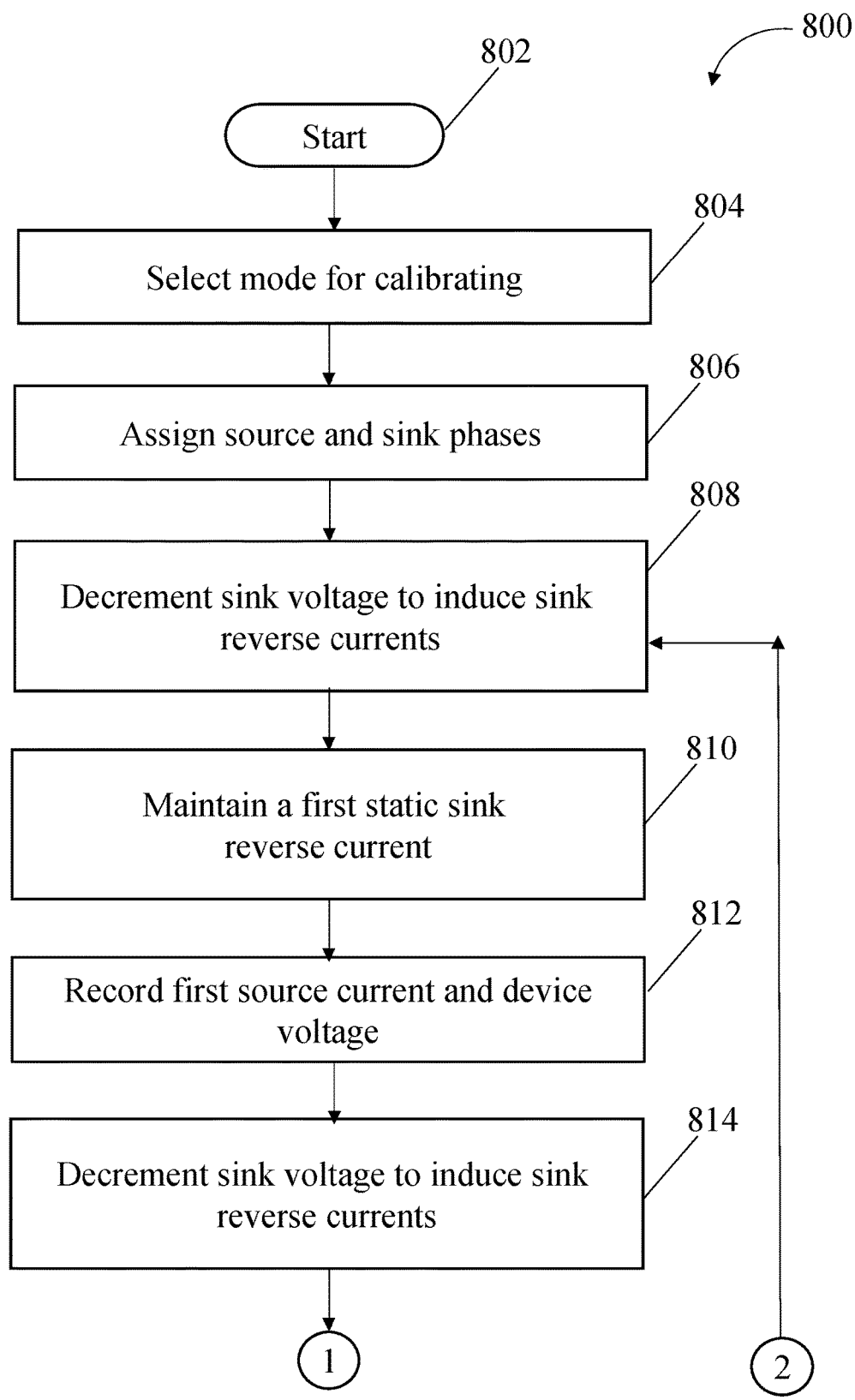
FIG. 8A is a flowchart illustrating a process for executing calibration operations for the architecture shown in FIG. 7, in accordance with some embodiments of the present disclosure.

Referring to FIG. 8A, a flowchart is presented illustrating a process 800 for executing calibration operations for the multiphase power supply circuit 700 using the calibration architecture 701, both shown in FIG. 7, in accordance with some embodiments of the present disclosure. Also referring to FIGS. 1 and 7, the process 800 starts 802 that includes employing the test management module 132 resident in the circuit self-testing tool 130. Specifically, in one embodiment, the maintenance operations mode selection module 134 selects 804 a calibration mode configured for calibrating the load line for the circuit 700. In at least some embodiments, the load line (not shown) is a portion of a graphical analysis of a portion of a circuit. The load line is typically rendered as a straight line with a negative slope representative of a current versus voltage characteristic of the portion of the circuit under consideration, i.e., the current gain. Therefore, the load line is related to the physical current gain characteristic within the device, and the gain is an adjustable feature. Upon selecting 804 the load line calibration mode, the source phases and the sink phases are assigned 806. In one embodiment, the source phase 204 and the sink phase 206 are assigned 806, respectively, through the circuit phase assignment module 136.

In at least some embodiments, the sink phase voltage control module 140 regulates the buck controller $222_Y$ to decrement 808 the sink voltage, i.e., $V_{Sink}$ (see FIG. 7) to induce sink reverse currents, i.e., first circuit test current 708, to a first predetermined value. In some embodiments, the $V_{Sink}$ is decremented in a sequence of decreasing values, e.g., and without limitation, two or more non-zero voltage decrements. In some embodiments, the $V_{Sink}$ is decremented in a smooth, continuous action without any stopping points until the test is ended. In some embodiments of the process 800, the source voltage, i.e., $V_{Source}$ (see FIG. 7) is measured and recorded through any mechanisms that enable operation of the calibration process 800 as described herein. In some embodiments, the first predetermined value for $I_{Source}$ (see FIG. 7) is the starting point for the load line calibration, i.e., the $V_{Sink}$ is decremented to establish that first value of $I_{Source}$. That first static sink reverse current $I_{Source}$ is maintained 810 for a predetermined period of time, and at least long enough to record 812 the first source current $I_{Source}$ and the first output voltage $V_{Source}$ induced by the buck controller $222_X$ through the data recordation module 142. In some embodiments, the sink currents $I_{Sink}$ (see FIG. 7) are recorded as well for additional calibration data. The sensing conduits $228_X$ and $228_Y$ transmit the $V_{Out}$ values to the respective buck controllers $222_X$ and $222_Y$ to further facilitate the regulation of $V_{Source}$ and/or $V_{Sink}$, and the subsequent circuit test current 708. Also, in at least some embodiments, the sink phase voltage control module 140 regulates the buck controller $222_Y$ to decrement 814 the sink voltage $V_{Sink}$ a second time to induce sink reverse currents, i.e., a second circuit test current 708, to a second predetermined value.

In general, the load line calibration process 800 requires at least two samplings of the output voltage of the circuit phase under two loading conditions, i.e., typically one sampling at a light load and another sampling at a heavy load, where light and heavy loadings are relative to the application circuit's design point for maximum load current.

Figure 8B:
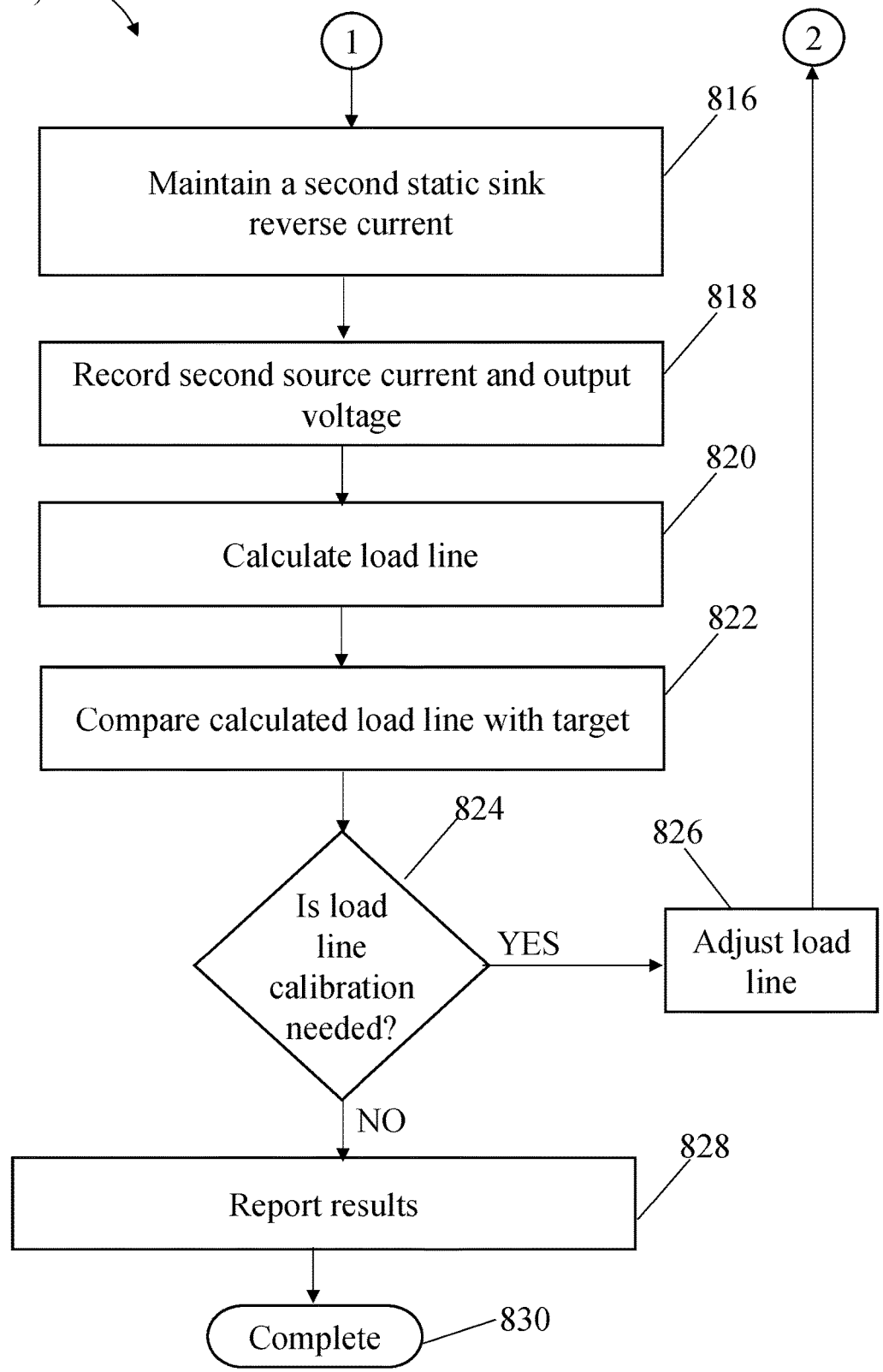
FIG. 8B is a continuation of the flowchart shown in FIG. 8A, in accordance with some embodiments of the present disclosure.

FIG. 8B is a continuation of the flowchart shown in FIG. 8A, in accordance with some embodiments of the present disclosure. Continuing to refer to FIGS. 1, 7, and 8A, in some embodiments, the second predetermined value for $I_{Source}$ is the second point for the load line calibration, i.e., the $V_{Sink}$ is further decremented to establish that second value of $I_{Source}$. That second static sink reverse current $I_{Source}$ is maintained 816 for a predetermined period of time, and at least long enough to record 818 the second source current $I_{Source}$ and the second output voltage $V_{Source}$ induced by the buck controller $222_X$ through the data recordation module 142. In some embodiments, two current/voltage data points are sufficient. In some embodiments, any number of current/voltage data points are collected through execution of the process steps 808 through 818.

In at least some embodiments, the load line is calculated 820 from the $I_{Source}$ and $V_{Source}$ data collected in process steps 812 and 818. The calculated load line is compared 822 with a target load line. The load line calibration module 148 operates a load line calibration decision module 824 that determines if device load line calibration is needed subject to the comparison process step 822. If "YES," a load line calibration is needed, and the device load line is adjusted 826. More specifically, the current gain of the respective portion of the circuit is adjusted by adjusting the respective voltage points such that the physical characteristics of the device behave more like the target load line. Upon completion of the gain adjustment, the process steps 808 through 826 are performed iteratively until the determination by the load line calibration decision module 824 is "NO." The process 800 advances to reporting 828 the results through the report module 152. The process 800 is completed 830.

Figure 9:
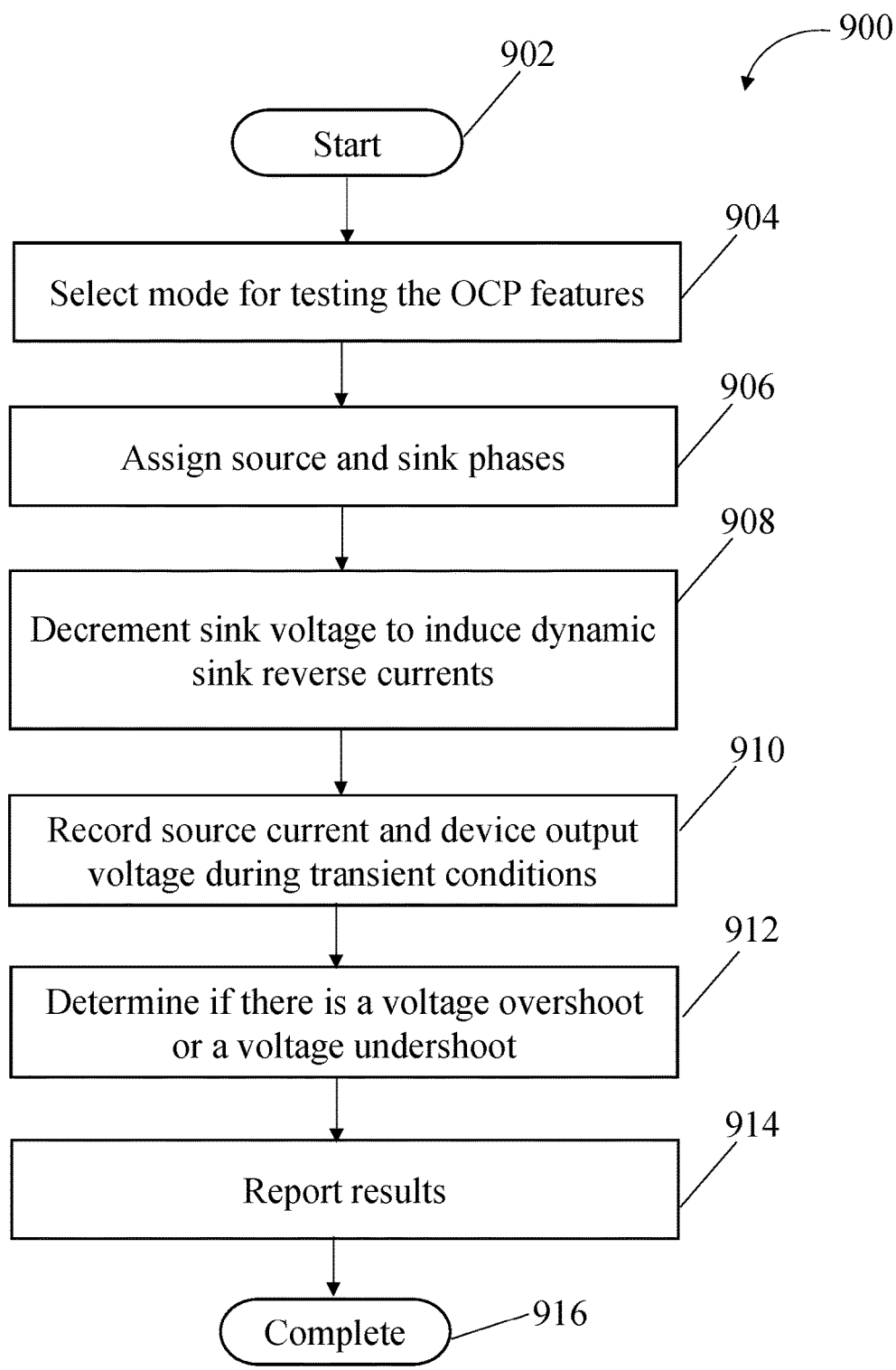
FIG. 9 is a flowchart illustrating a process for executing a determination of voltage undershoot and voltage overshoot for the architecture shown in FIG. 7, in accordance with some embodiments of the present disclosure.

Referring to FIG. 9, a flowchart is presented illustrating a process 900 for executing a determination of voltage undershoot and voltage overshoot for the architecture shown in FIG. 7, in accordance with some embodiments of the present disclosure. In general, the undervoltage/overvoltage determination operations executed by the calibration architecture 700 will not induce engagement of the OR'ing or OCP features as previously described herein. Also referring to FIGS. 1 and 7, the process 900 starts 902 that includes employing the test management module 132 resident in the circuit self-testing tool 130. Specifically, in one embodiment, the maintenance operations mode selection module 134 selects 904 a voltage overshoot/undershoot determination mode configured for determining voltage overshoot or undershoot under dynamic loading conditions of the multiphase power supply circuit 700. Upon selecting 904 the voltage overshoot/undershoot determination mode, the source phases and the sink phases are assigned 906. In one embodiment, the source phase 204 and the sink phase 206 are assigned 906, respectively, through the circuit phase assignment module 136.

In at least some embodiments, the sink phase voltage control module 140 regulates the buck controller $222_Y$ to decrement 908 the sink voltage, i.e., $V_{Sink}$ to induce sink reverse currents, i.e., circuit test current 708, to a predetermined value. In some embodiments, the $V_{Sink}$ is decremented in a sequence of decreasing values, e.g., and without limitation, three or more decrements. In some embodiments, the $V_{Sink}$ is decremented in a smooth, continuous action without any stopping points until the test is ended. In some embodiments of the process 900, the source voltage, i.e., $V_{Source}$ is measured and recorded 910 through any mechanisms that enable operation of the process 900 as described herein. The measurements of $V_{Source}$ are measured and recorded dynamically as the source current $I_{Source}$ (also measured and recorded 910) undergoes the transient conditions. The voltage over/undershoot determination module 150 executes a determination 912 if there is any voltage overshoot or undershoot with respect to $V_{Source}$. The process 900 advances to reporting 914 the results through the report module 152. The process 900 is completed 916.

The embodiments as disclosed and described herein are configured to provide an improvement to computer technology. Materials, operable structures, and techniques as disclosed herein can provide substantial beneficial technical effects. Some embodiments may not have all of these potential advantages and these potential advantages are not necessarily required of all embodiments. By way of example only, and without limitation, one or more embodiments may provide enhancements of using reverse currents to self-test multiphase power supply circuits.

In addition, the embodiments described herein improve the technological field associated with electrical powering of computing and other information technology devices. As such, the embodiments described herein integrate self-testing features of multiphase power supply regulators into a practical application that improves the functioning of computers and other technologies. The embodiments described herein are also configured for introduction into power supplies for other uses as well.

Moreover, the embodiments described herein leverage the physical configurations of multiphase power supplies with two or more parallel circuit phases to use one or more circuit phases to test one or more other phases. Therefore, external testing equipment for execution operations directed toward OR'ing testing, OCP testing, current gain calibration, and voltage overshoot/undershoot determination is not necessary. Furthermore, any additional operations that require modulation of a source phase current into a sink phase are enabled through the embodiments described herein. As such, the opportunities to test the power supply circuits without extensive additional test equipment and labor improve the reliability of such circuits through providing testing without having to overcome the aforementioned hurdles.

Furthermore, any impracticalities of testing the power supplies with external testing equipment due to their positioning, size, and quantities are overcome through the use of existing infrastructure. In addition, the resource time to test the power supplies decreases. Moreover, the reliance on the manufacturers FIT values is significantly mitigated. Also, the embodiments described herein facilitate testing where only digital communications are available.

In addition, in contrast to the known testing mechanisms, the sink voltage is decremented in a sequence of decreasing values, e.g., and without limitation, three or more decrements. In some embodiments, the sink voltage is decremented in a smooth, continuous action without any stopping points until the test is ended.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 10:
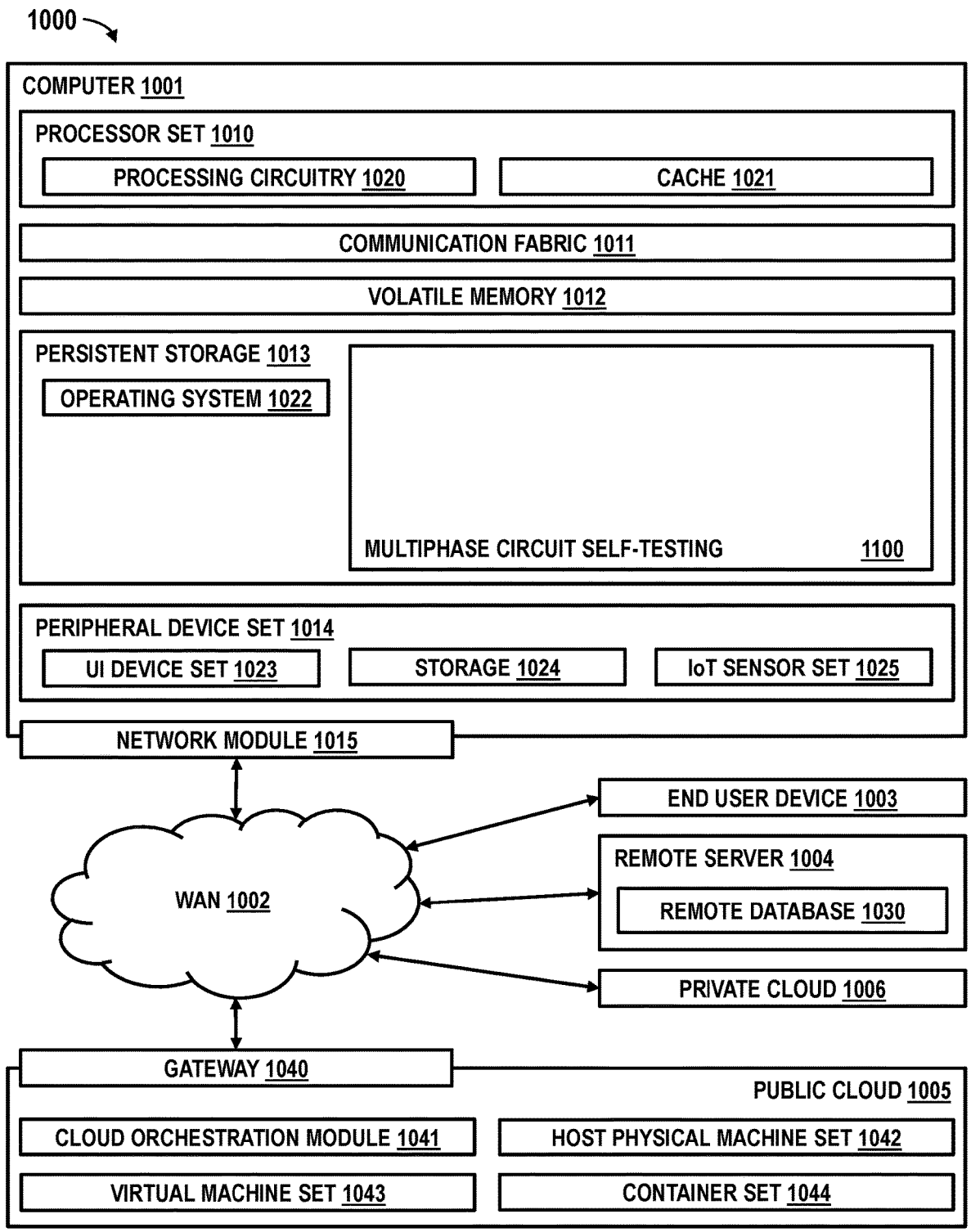
FIG. 10 is as block schematic diagram illustrating an example of a computing environment for the execution of at least some of the computer code involved in performing the disclosed methods described herein, in accordance with some embodiments of the present disclosure.

Referring to FIG. 10, a block schematic diagram is presented illustrating an example of a computing environment for the execution of at least some of the computer code involved in performing the disclosed methods described herein, in accordance with some embodiments of the present disclosure.

Computing environment 1000 contains an example of an environment for the execution of at least some of the computer code involved in performing the disclosed methods, such as multiphase self-testing code 1100. In addition to block 1100, computing environment 1000 includes, for example, computer 1001, wide area network (WAN) 1002, end user device (EUD) 1003, remote server 1004, public cloud 1005, and private cloud 1006. In this embodiment, computer 1001 includes processor set 1010 (including processing circuitry 1020 and cache 1021), communication fabric 1011, volatile memory 1012, persistent storage 1013 (including operating system 1022 and block 1100, as identified above), peripheral device set 1014 (including user interface (UI) device set 1023, storage 1024, and Internet of Things (IoT) sensor set 1025), and network module 1015. Remote server 1004 includes remote database 1030. Public cloud 1005 includes gateway 1040, cloud orchestration module 1041, host physical machine set 1042, virtual machine set 1043, and container set 1044.

Computer 1001 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 1030. As is well understood in the art of computer technology, and depending upon the technology, performance of a computer-implemented method may be distributed among multiple computers and/or between multiple locations. On the other hand, in this presentation of computing environment 1000, detailed discussion is focused on a single computer, specifically computer 1001, to keep the presentation as simple as possible. Computer 1001 may be located in a cloud, even though it is not shown in a cloud in FIG. 10. On the other hand, computer 1001 is not required to be in a cloud except to any extent as may be affirmatively indicated.

Processor set 1010 includes one, or more, computer processors of any type now known or to be developed in the future. Processing circuitry 1020 may be distributed over multiple packages, for example, multiple, coordinated integrated circuit chips. Processing circuitry 1020 may implement multiple processor threads and/or multiple processor cores. Cache 1021 is memory that is located in the processor chip package(s) and is typically used for data or code that should be available for rapid access by the threads or cores running on processor set 1010. Cache memories are typically organized into multiple levels depending upon relative proximity to the processing circuitry. Alternatively, some, or all, of the cache for the processor set may be located "off chip." In some computing environments, processor set 1010 may be designed for working with qubits and performing quantum computing.

Computer readable program instructions are typically loaded onto computer 1001 to cause a series of operational steps to be performed by processor set 1010 of computer 1001 and thereby effect a computer-implemented method, such that the instructions thus executed will instantiate the methods specified in flowcharts and/or narrative descriptions of computer-implemented methods included in this document (collectively referred to as "the disclosed methods"). These computer readable program instructions are stored in various types of computer readable storage media, such as cache 1021 and the other storage media discussed below. The program instructions, and associated data, are accessed by processor set 1010 to control and direct performance of the disclosed methods. In computing environment 1000, at least some of the instructions for performing the disclosed methods may be stored in block 1100 in persistent storage 1013.

Communication fabric 1011 is the signal conduction path that allows the various components of computer 1001 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

Volatile memory 1012 is any type of volatile memory now known or to be developed in the future. Examples include dynamic type random access memory (RAM) or static type RAM. Typically, volatile memory 1012 is characterized by random access, but this is not required unless affirmatively indicated. In computer 1001, the volatile memory 1012 is located in a single package and is internal to computer 1001, but, alternatively or additionally, the volatile memory may be distributed over multiple packages and/or located externally with respect to computer 1001.

Persistent storage 1013 is any form of non-volatile storage for computers that is now known or to be developed in the future. The non-volatility of this storage means that the stored data is maintained regardless of whether power is being supplied to computer 1001 and/or directly to persistent storage 1013. Persistent storage 1013 may be a read only memory (ROM), but typically at least a portion of the persistent storage allows writing of data, deletion of data and re-writing of data. Some familiar forms of persistent storage include magnetic disks and solid state storage devices. Operating system 1022 may take several forms, such as various known proprietary operating systems or open source Portable Operating System Interface-type operating systems that employ a kernel. The code included in block 1100 typically includes at least some of the computer code involved in performing the disclosed methods.

Peripheral device set 1014 includes the set of peripheral devices of computer 1001. Data communication connections between the peripheral devices and the other components of computer 1001 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 1023 may include components such as a display screen, speaker, microphone, wearable devices (such as goggles and smart watches), keyboard, mouse, printer, touchpad, game controllers, and haptic devices. Storage 1024 is external storage, such as an external hard drive, or insertable storage, such as an SD card. Storage 1024 may be persistent and/or volatile. In some embodiments, storage 1024 may take the form of a quantum computing storage device for storing data in the form of qubits. In embodiments where computer 1001 is required to have a large amount of storage (for example, where computer 1001 locally stores and manages a large database) then this storage may be provided by peripheral storage devices designed for storing very large amounts of data, such as a storage area network (SAN) that is shared by multiple, geographically distributed computers. IoT sensor set 1025 is made up of sensors that can be used in Internet of Things applications. For example, one sensor may be a thermometer and another sensor may be a motion detector.

Network module 1015 is the collection of computer software, hardware, and firmware that allows computer 0101 to communicate with other computers through WAN 1002. Network module 1015 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 1015 are performed on the same physical hardware device. In other embodiments (for example, embodiments that utilize software-defined networking (SDN)), the control functions and the forwarding functions of network module 1015 are performed on physically separate devices, such that the control functions manage several different network hardware devices. Computer readable program instructions for performing the disclosed methods can typically be downloaded to computer 1001 from an external computer or external storage device through a network adapter card or network interface included in network module 1015.

WAN 1002 is any wide area network (for example, the internet) capable of communicating computer data over non-local distances by any technology for communicating computer data, now known or to be developed in the future. In some embodiments, the WAN 1002 may be replaced and/or supplemented by local area networks (LANs) designed to communicate data between devices located in a local area, such as a Wi-Fi network. The WAN or LANs typically include computer hardware such as copper transmission cables, optical transmission fibers, wireless transmission, routers, firewalls, switches, gateway computers and edge servers.

End user device (EUD) 1003 is any computer system that is used and controlled by an end user (for example, a customer of an enterprise that operates computer 1001), and may take any of the forms discussed above in connection with computer 101. EUD 1003 typically receives helpful and useful data from the operations of computer 1001. For example, in a hypothetical case where computer 1001 is designed to provide a recommendation to an end user, this recommendation would typically be communicated from network module 1015 of computer 1001 through WAN 1002 to EUD 1003. In this way, EUD 1003 can display, or otherwise present, the recommendation to an end user. In some embodiments, EUD 1003 may be a client device, such as thin client, heavy client, mainframe computer, desktop computer and so on.

Remote server 1004 is any computer system that serves at least some data and/or functionality to computer 1001. Remote server 1004 may be controlled and used by the same entity that operates computer 1001. Remote server 1004 represents the machine(s) that collect and store helpful and useful data for use by other computers, such as computer 1001. For example, in a hypothetical case where computer 1001 is designed and programmed to provide a recommendation based on historical data, then this historical data may be provided to computer 1001 from remote database 1030 of remote server 1004.

Public cloud 1005 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 1005 is performed by the computer hardware and/or software of cloud orchestration module 1041. The computing resources provided by public cloud 1005 are typically implemented by virtual computing environments that run on various computers making up the computers of host physical machine set 1042, which is the universe of physical computers in and/or available to public cloud 1005. The virtual computing environments (VCEs) typically take the form of virtual machines from virtual machine set 1043 and/or containers from container set 1044. It is understood that these VCEs may be stored as images and may be transferred among and between the various physical machine hosts, either as images or after instantiation of the VCE. Cloud orchestration module 1041 manages the transfer and storage of images, deploys new instantiations of VCEs and manages active instantiations of VCE deployments. Gateway 1040 is the collection of computer software, hardware, and firmware that allows public cloud 1005 to communicate through WAN 1002.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 1006 is similar to public cloud 1005, except that the computing resources are only available for use by a single enterprise. While private cloud 1006 is depicted as being in communication with WAN 1002, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 1005 and private cloud 1006 are both part of a larger hybrid cloud.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer system for using reverse currents to self-test multiphase power supply circuits comprising:
   one or more multiphase power supply circuits comprising
      a plurality of circuit phases, each multiphase power supply circuit of the one or more multiphase power supply circuits electrically coupled to a plurality of electric power phases, wherein each circuit phase of the plurality of circuit phases is coupled to an electric power phase of the plurality of electric power phases;
   one or more processing devices;
   one or more memory devices communicatively and operably coupled to the one or more processing devices;
   a circuit self-testing tool at least partially resident within the one or more memory devices, the circuit self-testing tool communicatively and operably coupled to the one or more multiphase power supply circuits and the one or more processing devices, the circuit self-testing tool configured to:
      execute one or more operations on at least two circuit phases of the one or more multiphase power supply circuits comprising:
         adjust a voltage on one or more first phases of the plurality of circuit phases to a plurality of voltages; and
         induce a reverse current from one or more second phases of the plurality of circuit phases to the one or more first phases.

2. The system of claim 1, further comprising:
   one or more digital communications connections communicatively and operably coupled to the circuit self-testing tool and the at least two circuit phases of the one or more multiphase power supply circuits.

3. The system of claim 1, further comprising:
   a maintenance operations mode selection module configured to select one or more of:
      an OR'ing determination;
      an overcurrent protection (OCP) determination;
      a load line calibration; and
      a voltage undershoot and overshoot determination.

4. The system of claim 1, further comprising:
   a circuit phase assignment module configured to select:
      one of the first phase and the second phase as the source phase; and
      one of the second phase and the first phase as the sink phase.

5. The system of claim 1, further comprising:
   a source phase voltage control module; and
   a sink phase voltage control module.

6. The system of claim 5, wherein the circuit self-testing tool is further configured to induce the reverse current through one or more of:
   decrementing the sink voltage through the sink phase voltage control module; and
   incrementing the source voltage through the source phase voltage control module.

7. The system of claim 6, wherein the circuit self-testing tool is further configured to induce the reverse current through one or more of:
   decrementing the sink voltage in a sequence of decreasing values;
   incrementing the source voltage in a sequence of increasing values;
   decrementing the sink voltage in a smooth, continuous action until the operation of the one or more operations is ended; and
   incrementing the source voltage in a smooth, continuous action until the operation of the one or more operations is ended.

8. The system of claim 1, wherein the circuit self-testing tool is fully resident within the one or more memory devices.

9. A computer program product, comprising:
   one or more computer readable storage media; and program instructions collectively stored on the one or more computer storage media, the program instructions comprising:
program instructions to execute one or more operations on at least two circuit phases of one or more multi-phase power supply circuits, wherein the one or more multiphase power supply circuits include a plurality of circuit phases, each multiphase power supply circuit of the one or more multiphase power supply circuits is electrically coupled to a plurality of electric power phases, wherein each circuit phase of the plurality of circuit phases is coupled to an electric power phase of the plurality of electric power phases, the program instructions to execute the one or more operations comprising:
program instructions to adjust a voltage on one or more first phases of the plurality of circuit phases to a plurality of voltages; and
program instructions to induce a reverse current from one or more second phases of the plurality of circuit phases to the one or more first phases.

10. The computer program product of claim 9, further comprising:
program instructions to communicate between a circuit self-testing tool and the at least two circuit phases of the one or more multiphase power supply circuits through one or more digital communications connections.

11. The computer program product of claim 9, further comprising executing the one or more operations comprising:
program instructions to execute an OR'ing determination;
program instructions to execute an overcurrent protection (OCP) determination;
program instructions to execute a load line calibration; and
program instructions to execute a voltage undershoot and overshoot determination.

12. The computer program product of claim 9, further comprising:
program instructions to select a source phase and a sink phase from the one or more first phases and the one or more second phases.

13. The computer program product of claim 12, further comprising program instructions to induce the reverse current through one or more of:
program instructions to decrement a sink voltage; and
program instructions to increment a source voltage.

14. The computer program product of claim 12, further comprising program instructions to induce the reverse current through one or more of:
program instructions to decrement the sink voltage in a sequence of decreasing values;
program instructions to increment the source voltage in a sequence of increasing values;
program instructions to decrement the sink voltage in a smooth, continuous action until the operation of the one or more operations is ended; and
program instructions to increment the source voltage in a smooth, continuous action until the operation of the one or more operations is ended.

15. A computer-implemented method for using reverse currents to self-test multiphase power supply circuits comprising:
executing one or more operations on at least two circuit phases of one or more multiphase power supply circuits, wherein the one or more multiphase power supply circuits include a plurality of circuit phases, each multiphase power supply circuit of the one or more multiphase power supply circuits is electrically coupled to a plurality of electric power phases, wherein each circuit phase of the plurality of circuit phases is coupled to an electric power phase of the plurality electric power phases, the executing the one or more operations comprising:
adjusting a voltage on one or more first phases of the plurality of circuit phases to a plurality of voltages; and
inducing a reverse current from one or more second phases of the plurality of circuit phases to the one or more first phases.

16. The method of claim 15, further comprising:
communicating between a circuit self-testing tool and the at least two circuit phases of the one or more multiphase power supply circuits through one or more digital communications connections.

17. The method of claim 15, further comprising the executing one or more operations comprising:
executing an OR'ing determination;
executing an overcurrent protection (OCP) determination;
executing a load line calibration; and
executing a voltage undershoot and overshoot determination.

18. The method of claim 15, further comprising:
selecting a source phase and a sink phase from the one or more first phases and the one or more second phases.

19. The method of claim 18, further comprising inducing the reverse current through one or more of:
decrementing a sink voltage; and
incrementing a source voltage.

20. The method of claim 18, further comprising inducing the reverse current through one or more of:
decrementing the sink voltage in a sequence of decreasing values;
incrementing the source voltage in a sequence of increasing values;
decrementing the sink voltage in a smooth, continuous action until the operation of the one or more operations is ended; and
incrementing the source voltage in a smooth, continuous action until the operation of the one or more operations is ended.

* * * * *